(54) SYSTEM AND METHOD FOR MEMORY SELF-TIMED REFRESH FOR REDUCED POWER CONSUMPTION

(75) Inventors: Edward T. Gerchman, Endwell; Mark C. Gildea, Apalachin, both of NY (US); William P. Hovis; Randall S. Jensen, both of Rochester, MN (US); Warren E. Maule, Cedar Park, TX (US); Thomas J. Osten; Andrew H. Wottreng, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/144,593

(22) Filed: Aug. 31, 1998

(51) Int. Cl.$^7$ .................................................... G06F 12/00
(52) U.S. Cl. ...................... 711/106; 711/167; 365/222; 714/746; 714/754
(58) Field of Search ................... 711/106, 159, 711/167; 365/222; 714/746, 754

(56) References Cited

U.S. PATENT DOCUMENTS

| | | | |
|---|---|---|---|
| 4,130,899 | 12/1978 | Bowman et al. | 365/222 |
| 4,334,295 | 6/1982 | Nagami | 365/222 |
| 4,570,242 | 2/1986 | Nagami | 365/222 |
| 4,680,737 | 7/1987 | Oishi et al. | 365/222 |
| 4,688,196 | 8/1987 | Inagaki et al. | 365/222 |
| 4,710,903 | 12/1987 | Hereth et al. | 365/194 |
| 4,716,551 | 12/1987 | Inagaki | 365/222 |
| 4,771,406 | 9/1988 | Oishi et al. | 365/222 |
| 5,148,546 | 9/1992 | Blodgett | 713/320 |
| 5,150,329 | 9/1992 | Hoshi | 365/222 |
| 5,161,120 | 11/1992 | Kajimoto et al. | 365/189.05 |
| 5,229,970 | 7/1993 | Lee et al. | 365/222 |
| 5,262,998 | 11/1993 | Mnich et al. | 365/222 |
| 5,365,487 | 11/1994 | Patel et al. | 365/226 |
| 5,400,289 | 3/1995 | Blodgett | 365/222 |
| 5,446,695 | 8/1995 | Douse et al. | 365/222 |
| 5,465,367 | 11/1995 | Reddy et al. | 365/222 |
| 5,469,386 | 11/1995 | Obara | 365/189.07 |
| 5,471,430 | * 11/1995 | Sawada et al. | 365/222 |
| 5,539,703 | 7/1996 | Manning | 365/222 |
| 5,544,121 | 8/1996 | Dosaka et al. | 365/222 |
| 5,586,287 | 12/1996 | Okumura et al. | 711/106 |
| 5,590,082 | 12/1996 | Abe | 365/222 |
| 5,619,457 | 4/1997 | Hayakawa et al. | 365/189.05 |
| 5,630,090 | * 5/1997 | Keehn et al. | 711/106 |
| 5,636,171 | 6/1997 | Yoo et al. | 365/222 |
| 5,644,545 | 7/1997 | Fisch | 365/222 |
| 5,654,930 | 8/1997 | Yoo et al. | 365/222 |
| 5,703,823 | 12/1997 | Douse et al. | 365/222 |
| 5,712,825 | 1/1998 | Hadderman et al. | 365/222 |
| 5,717,644 | 2/1998 | Hadderman et al. | 365/222 |
| 5,748,547 | * 5/1998 | Shau | 365/222 |
| 5,907,857 | * 5/1999 | Biswas | 711/106 |
| 5,966,725 | 10/1999 | Tabo . | |

FOREIGN PATENT DOCUMENTS 9007367    6/1995   (JP) .

* cited by examiner

Primary Examiner—Matthew Kim
Assistant Examiner—Matthew D. Anderson
(74) Attorney, Agent, or Firm—Shelly M Beckstrand

(57) ABSTRACT

A memory controller, upon detecting an interval of inactivity (that is, no read or write access from a processor or I/O devices with respect to main storage or memory SDRAMs) halts external refresh commands from the processor, and initiates STR mode in main storage to preserve data contents in the memory SDRAMs and to save energy. Then, upon detecting a read or write operation, the memory controller signals main storage to exit STR mode.

11 Claims, 3 Drawing Sheets

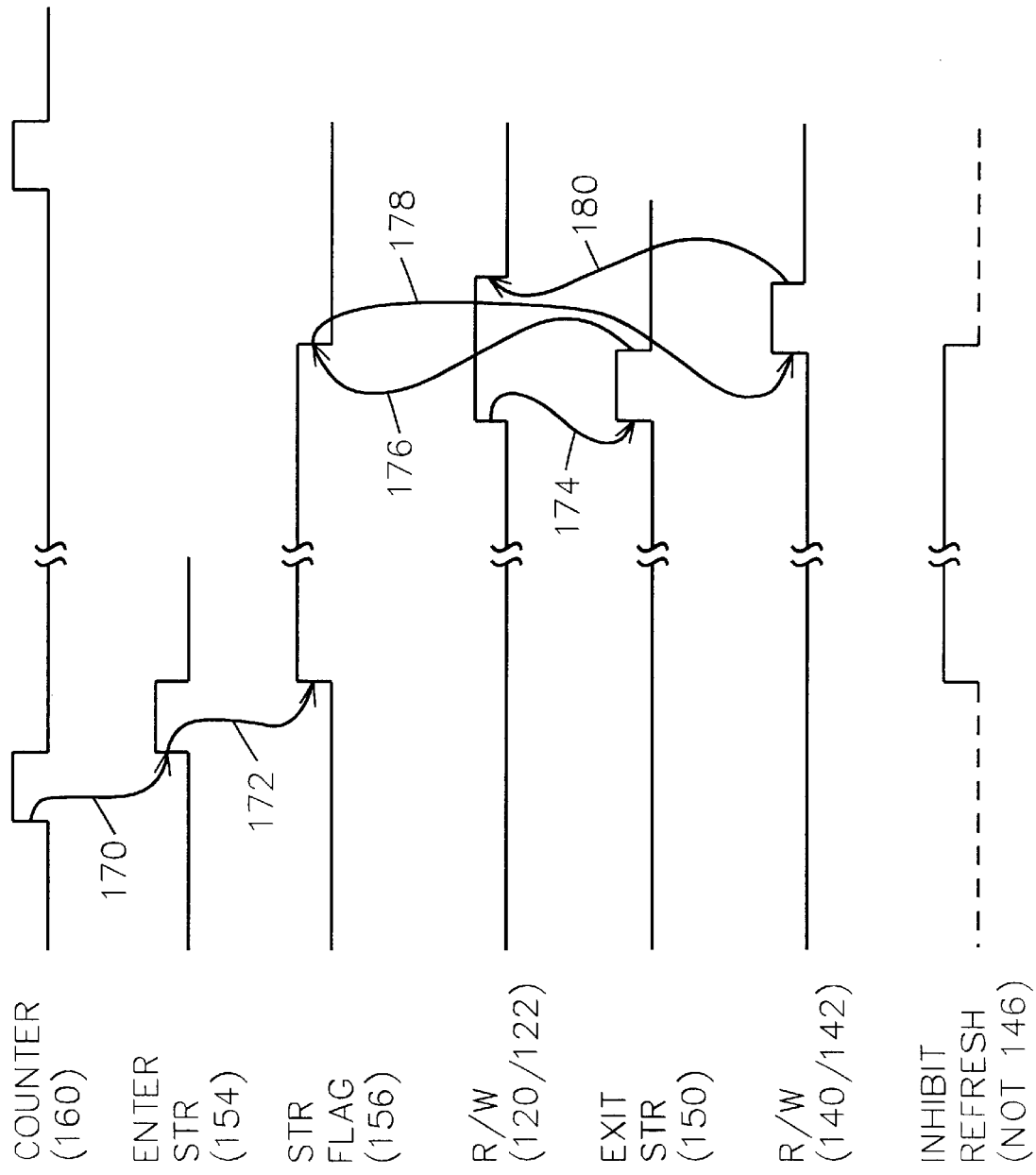

SYSTEM AND METHOD FOR MEMORY SELF-TIMED REFRESH FOR REDUCED POWER CONSUMPTION

BACKGROUND OF THE INVENTION

CROSS REFERENCES TO RELATED APPLICATIONS

U.S. patent application Ser. No. 09/144,248, entitled "System and Method for Memory Scrub During Self Timed Refresh", filed concurrently herewith is assigned to the same assignee hereof and contains subject matter related, in certain respect, to the subject matter of the present application. The above-identified patent application is incorporated herein by reference.

TECHNICAL FIELD OF THE INVENTION

This invention relates to refresh of memory subsystems. More particularly, it relates to reduced power memory refresh of SDRAM memory subsystems.

BACKGROUND ART

Dynamic Random Access Memory (DRAM) chips need to have the charge in their array cells periodically refreshed to retain the data contents. This refresh is normally initiated by commands issued by a memory controller external to the DRAMs. Synchronous DRAMs (SDRAMS) provide a mode, Self-Timed Refresh (STR) mode, during which the SDRAM initiates refresh internally provided no read or write accesses to memory occur. Computer SDRAM memory subsystems utilize less power for STR mode verses externally initiated refresh. However, energy is wasted when an SDRAM is not actively being accessed to read or write data but is still kept fully powered and periodically refreshed via externally issued refresh.

It is an object of the invention to provide improved, energy efficient memory refresh system and method.

SUMMARY OF THE INVENTION

In accordance with the invention, a memory controller for a synchronous dynamic random access memory (SDRAM) is provided which, upon detecting an interval of memory inactivity, halts external refresh commands, initiates self timed refresh (STR) mode, and, upon detecting a read or write operation, exits STR mode.

Other features and advantages of this invention will become apparent from the following detailed description of the presently preferred embodiment of the invention, taken in conjunction with the accompanying drawings.

BRIEF DESCRIPTION OF THE DRAWINGS

FIG. 3 illustrates the operation of the memory controller of FIG. 2.

BEST MODE FOR CARRYING OUT THE INVENTION

Figure 1:
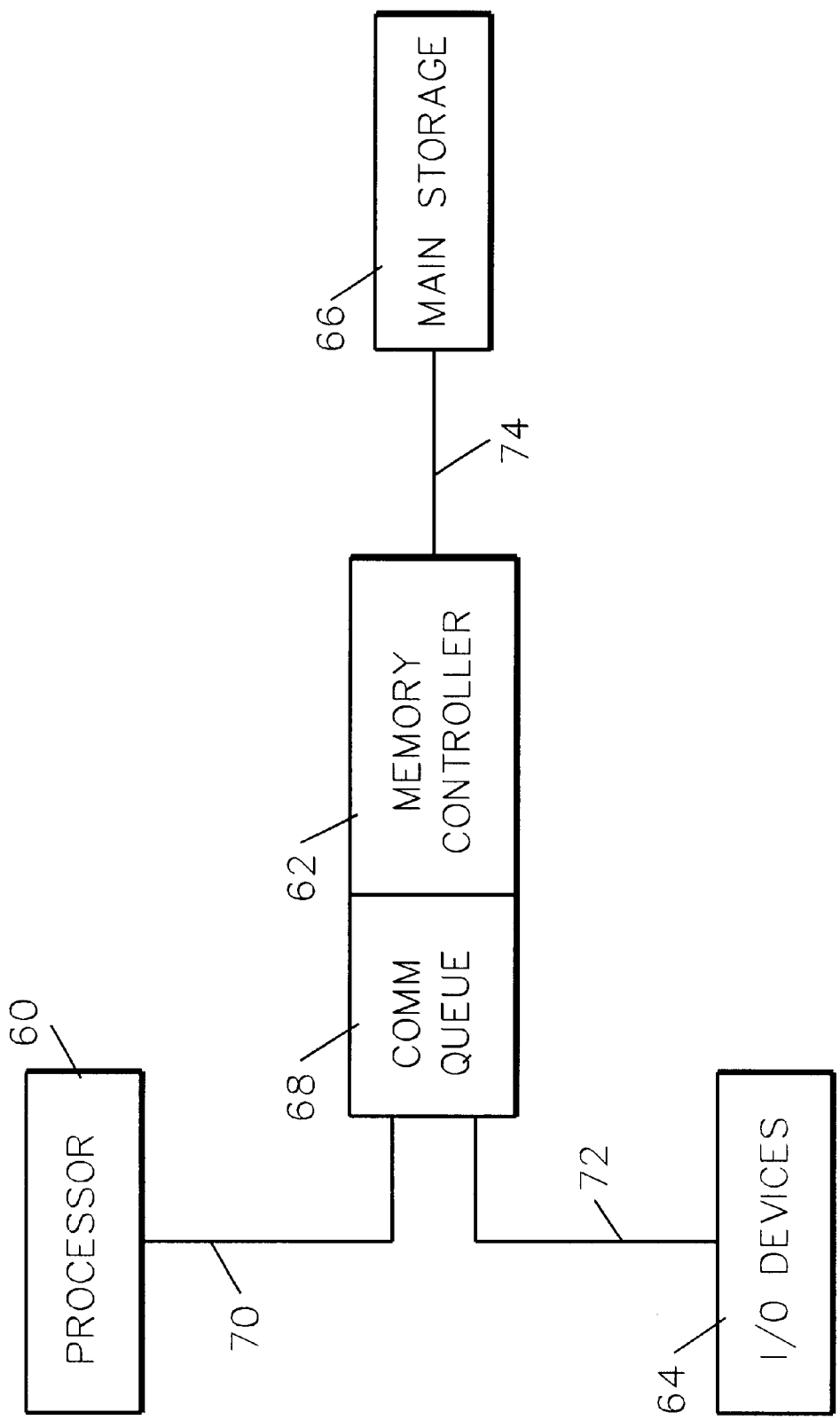
FIG. 1 illustrates a system including the memory controller of the preferred embodiment of the invention.

Referring to FIG. 1, memory controller 62 interfaces main storage 66 on memory bus 74 to processor 60 and I/O devices 64 via an internal command queue 68 which interfaces system bus 70 and I/O bus 72.

In operation, memory controller 62 detects an interval of inactivity; that is, no read or write access from processor 60 or I/O devices 64 with respect to main storage (also referred to as memory SDRAMs) 66. Upon detecting such an interval of inactivity, controller 62 halts external refresh commands from processor 60, initiates STR mode in storage 66 to preserve data contents in the memory SDRAMs and to save energy. Then, upon detecting a read or write operation, controller 62 signals storage 66 to exit STR mode.

Figure 2:
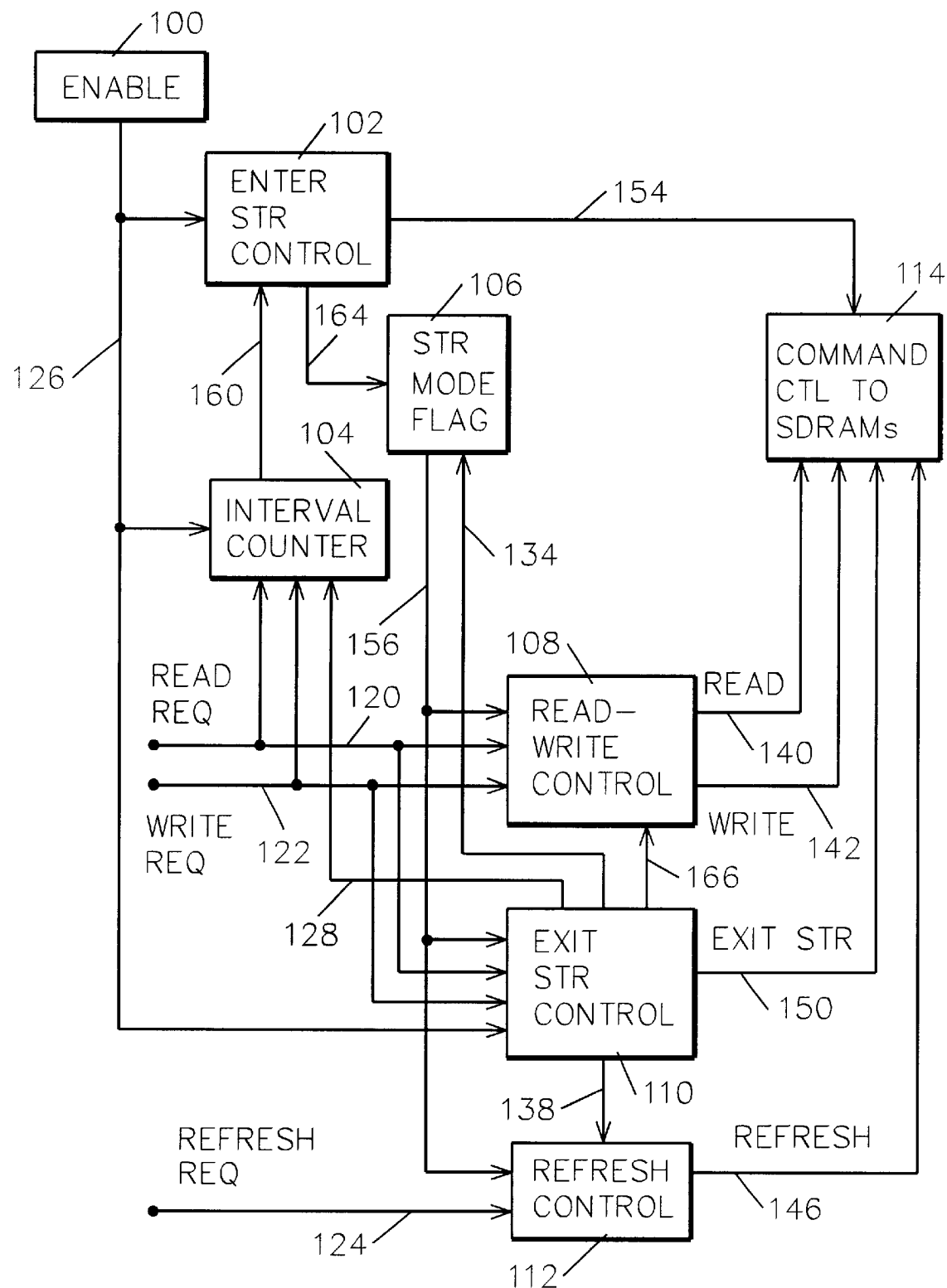
FIG. 2 illustrates the memory controller of FIG. 1 in greater detail.

Referring to FIG. 2, in accordance with the preferred embodiment of the invention, memory controller 62 includes enable 100, enter STR control 102, interval counter 104, STR mode flag 106, read-write control 108, exit STR control 110, refresh control 112, and command control 114 to SDRAMs 66.

Enable 100, a programmable bit set from processor 60, is fed on line 126 to enter STR control block 102, interval counter 104 and exit STR control block 110. Read request line 120 and write request line 122 are each fed to interval counter 104, read-write control block 108, and exit STR control block 110. Refresh request line 124 is fed to refresh control 112, the output of which is fed on line 146 to command control block 114. Outputs from enter STR control block 102 are fed on line 154 to command control 114 and line 164 to SR mode flag 106, the output of which is fed on line 156 to read-write control block 108, exit STR control block 110 and refresh control block 112. Outputs from read-write control block 108 are fed on read line 140 and write line 142 to command control block 114. Outputs from exit STR control block 110 are fed on line 128 to interval counter 104, line 134 to STR mode flag 106, line 138 to refresh control 112, line 166 to read-write control 108 and exit STR line 150 to command control block 114.

Write request lines 122 and read request line 120 originate at command queue 68, and carry commands directed to the memory SDRAMs 66 from processor 60 or I/O device 64. Refresh request line 124 is generated within memory controller 62 by a refresh interval counter, a programmable interval counter not shown.

Enable 100 is a programmable bit that enables the reduced power function of the preferred embodiment of the invention. Its output on line 126 defines whether or not to activate the reduced power consumption function. Enable 100 is used, for example, during test to isolate normal (that is, other than reduced power) operation of memory controller 62.

Enter STR (self timed refresh) control 102 initiates the STR mode to memory SDRAMS 66 via command control block 114, which puts the SDRAMS in self time refresh (STR) mode.

Interval counter 104 detects a period of inactivity to SDRAMs 66 (that is, whether there has been no read or write requests 120/122 to the SDRAMs for a programmed time interval), and signals enter STR mode control 102 to issue the STR command 154. Counter 104 is a mechanism for counting memory controller 62 cycles and to detect a programmable interval during which no read nor write operations to memory 66 occur.

STR mode flag 106 is a bit that indicates whether or not SDRAMS 66 are in self timed refresh mode at any given point of time. This is a flag that is set by line 164 when entering STR mode, and reset by line 134 when STR mode is exited.

Read-write control 108 is the normal controller that takes care of reads and writes to the SDRAMs: it initiates reads and writes commands 140/142 to memory 66 as part of the normal memory controller 62 operation. It is also a mechanism for allowing delayed read or write operations 120, 122 to access memory SDRAMs 66 normally.

Exit STR control 110 issues the exit STR command 150 to the SDRAMS in the event of a memory read or write request 120/122, and it will also signal on line 166 the read write control logic 108 to go ahead with the read or write operation when the STR mode is exited. It is a mechanism to detect a read or write operation (lines 120 or 122 active) while memory SDRAMs 66 are in STR mode (line 156 active), to delay the operation (line 166) until the memory SDRAMs can exit STR mode, to signal (line 150) the memory SDRAMs to exit STR mode, to immediately issue (line 138) a refresh command, and to resume (line 128) detection of an interval of memory inactivity.

Refresh control 112 is responsive to refresh request line 124 to initiate refresh commands 146 to the SDRAMs as well as to halt the normal refresh commands to the SDRAMS when in STR mode. When in STR mode, SDRAMS 66 don't need externally initiated refresh commands. That is, whenever line 156 is positive, then refresh 146 is inhibited.

In operation, processor 60 software provides a programmable interval value to a register (not shown) in memory controller 62. Memory controller 62 reads the interval value into interval counter 104. Interval counter 104 is decremented once every memory controller 62 clock cycle. Whenever a memory read operation 120 or memory write operation 122 is requested by processor 60 or I/O device 64 occurs, interval counter 104 is reloaded with the initial value from the interval register and decrementing begins anew. When interval counter 104 decrements to zero, this indicates no memory read or write operations have occurred within the programmed interval, and this state is signaled on line 160. (Alternatively, a count-up mechanism to a fixed or programmed threshold could be used.) Responsive to the signal on line 160, memory controller 62 stops sending external refresh commands on line 146 to memory 66, and sends a command on line 154 to memory SDRAMs 66 to initiate STR mode. Memory controller 62 then turns on flag 106 to indicate that memory SDRAMs 66 are in STR mode. While SDRAMs 66 remain in STR mode they provide their own internal refresh and use much less energy (on the order of 20% or less) than non-accessed SDRAMs with externally initiated distributed refresh commands every 15.6 microseconds.

When memory controller 62 detects a memory read or write request on line 120 or 122, and STR mode flag 106 is on indicating the memory SDRAMs 66 are in STR mode, exit STR control 110 of memory controller 62 delays the read or write operation and signals on line 150 the memory SDRAMs 66 to exit STR mode. After memory SDRAMs 66 exit STR mode, memory controller 62 immediately issues a refresh command 146 to the SDRAMs to ensure data retention, turns off flag indicator 106, and then allows the delayed read or write operation 120/122 to access memory 66 normally. Memory controller 62 then reloads interval counter 104 with the value from the interval register and begins decrementing to detect another interval of memory inactivity.

One of the features of this preferred embodiment is the relatively small number of cycles required to cause the SDRAMs to enter and exit STR mode. Because of this a small interval can be programmed such that memory controller 62 causes the SDRAMs to use STR mode very frequently. In alternative implementations, where a larger number of cycles are required to enter and exit STR mode, a larger interval could be programmed or the count register (interval counter 104) could be decremented by a larger period—for example, decrementing once every refresh period (15.6 micro seconds) rather than once every memory cycle.

Referring to FIG. 3, the operation of the preferred embodiment is illustrated by way of a timing chart. Responsive (170) to signal 160 going positive, enter STR mode line 154 is activated, which also causes (172) STR flag output line 156 to go positive. After some indeterminate interval, in this example, when either read 120 or write 122 line goes active, exit STR line 150 is driven (174) to go positive. The fall of line 150 coincides (176) with a signal on line 134 driving STR flag 156 to turn off, and a signal on line 166 enables (178) read or write operations 140/142. Upon completion (180) of read/write 140/142, read/write 120/122 goes inactive. As long as STR flag 156 is active, refresh 146 is inhibited (illustrated in this example by not 146 being active.)

Advantages Over the Prior Art

The advantages of the system and method of the preferred embodiment of this invention include the provision of an improved, energy efficient memory refresh system and method.

Alternative Embodiments

It will be appreciated that, although specific embodiments of the invention have been described herein for purposes of illustration, various modifications may be made without departing from the spirit and scope of the invention. In particular, it is within the scope of the invention to provide a memory device, such as a transmission medium, magnetic or optical tape or disc, or the like, for storing signals for controlling the operation of a computer to function as a memory controller according to the method of the invention and/or to structure its components in accordance with the system of the invention.

Accordingly, the scope of protection of this invention is limited only by the following claims and their equivalents.

We claim:

1. A method for refreshing memory, comprising the steps of:
   selectively enabling and detecting a predetermined, programmable interval of memory inactivity;
   upon detecting said interval of memory inactivity, halting external refresh commands and externally initiating storage self timed refresh (STR) mode; and
   upon detecting a storage request, exiting storage STR mode.

2. The method of claim 1, said detecting step including measuring the elapsed time since a last storage read or write request.

3. The method of claim 2, further comprising the step of selectively enabling and disabling said detecting, halting, initiating and exiting steps to isolate normal operation.

4. The method of claim 1, further comprising the steps of:
   responsive to receipt of a storage request while said memory is in STR mode, delaying said storage request until memory exits STR mode and thereupon servicing said storage request, and immediately after servicing said storage request, refreshing said memory.

5. The method of claim 1, further comprising the steps of:
   responsive to receipt of a storage request while said memory is in STR mode, delaying said storage request until memory exits STR mode, refreshing said memory, and thereafter servicing said storage request.

6. A system for refreshing memory, comprising:

a storage controller interfacing said memory to a processor;

said storage controller being responsive to storage requests from said processor for selectively reading from and writing to said memory;

said storage controller further including a programmable interval timer for determining the elapsed time since a last storage request;

a read/write controller for reading and writing with respect to said memory;

an enter STR controller responsive to said interval timer determining the elapse of a predetermined time since said last storage request for placing said memory in STR mode; and an exit STR controller for detecting a storage request while said memory is in STR mode, delaying said storage request until said memory exits STR mode, and thereafter allowing said storage request and issuing to said memory periodic automatic refresh commands.

7. The system of claim 6, said storage controller further comprising:

a refresh controller selectively responsive to externally initiated refresh commands when said memory is not in STR mode for refreshing said memory.

8. The system of claim 7, said memory comprising a synchronous dynamic random access memory (SDRAM).

9. A program storage device tangibly embodying a program of instructions to perform method steps for refreshing memory, said method steps comprising:

selectively enabling and detecting a programmable predetermined interval of storage inactivity;

upon detecting said interval of storage inactivity, externally halting external refresh commands and initiating storage self timed refresh (STR) mode; and upon detecting a storage request, exiting storage STR mode.

10. An article of manufacture comprising:

a computer medium having computer program code embodied therein for refreshing memory, the computer program code in said article of manufacture comprising:

code selectively enabled for causing a computer to effect detecting a programmable predetermined interval of storage inactivity;

code for causing a computer to effect, upon detecting said interval of storage inactivity, halting external refresh commands and initiating storage self timed refresh (STR) mode; and code for causing a computer to effect, upon detecting a storage request, exiting storage STR mode.

11. A method for refreshing memory, comprising the steps of:

selectively enabling and detecting a predetermined, programmable interval of memory inactivity;

upon detecting said interval of memory inactivity, halting external refresh commands and externally initiating storage self timed refresh (STR) mode;

upon detecting a storage request, exiting storage STR mode; and responsive to receipt of a storage request while said memory is in STR mode, delaying said storage request until memory exits STR mode and thereupon servicing said storage request, and immediately after servicing said storage request, refreshing said memory.

* * * * *